US010996531B1

(12) United States Patent
Higashi et al.

(10) Patent No.: US 10,996,531 B1
(45) Date of Patent: May 4, 2021

(54) DISPLAY DEVICE ELECTRICAL LINES

(71) Applicant: Panasonic Liquid Crystal Display Co., Ltd., Himeji (JP)

(72) Inventors: Asuka Higashi, Hyogo (JP); Teruhisa Nakagawa, Hyogo (JP)

(73) Assignee: PANASONIC LIQUID CRYSTAL DISPLAY CO., LTD., Hyogo (JP)

( * ) Notice: Subject to any disclaimer, the term of this patent is extended or adjusted under 35 U.S.C. 154(b) by 0 days.

(21) Appl. No.: 16/788,766

(22) Filed: Feb. 12, 2020

(51) Int. Cl.
*G02F 1/1362* (2006.01)
*G02F 1/1345* (2006.01)
*G02F 1/1335* (2006.01)
*G02F 1/1339* (2006.01)
*G02F 1/1368* (2006.01)
*H01L 27/12* (2006.01)

(52) U.S. Cl.
CPC ...... *G02F 1/136286* (2013.01); *G02F 1/1368* (2013.01); *G02F 1/13394* (2013.01); *G02F 1/13452* (2013.01); *G02F 1/133514* (2013.01); *H01L 27/124* (2013.01)

(58) Field of Classification Search
None
See application file for complete search history.

(56) References Cited

U.S. PATENT DOCUMENTS

| 2004/0239650 | A1* | 12/2004 | Mackey | G06F 3/047 345/174 |
| 2007/0030409 | A1* | 2/2007 | Aoki | G02F 1/1345 349/56 |
| 2007/0296674 | A1* | 12/2007 | Aoki | G02F 1/1345 345/94 |
| 2016/0020224 | A1* | 1/2016 | Kawamura | H01L 27/1248 345/213 |
| 2016/0093261 | A1* | 3/2016 | Kawamura | G09G 3/3648 345/204 |
| 2016/0093640 | A1* | 3/2016 | Kawamura | H01L 27/124 257/72 |
| 2016/0148549 | A1* | 5/2016 | Okumoto | G09G 3/006 324/760.02 |
| 2019/0228711 | A1* | 7/2019 | Murai | G09G 3/3225 |
| 2019/0302553 | A1* | 10/2019 | Nakagawa | G02F 1/13454 |
| 2019/0392762 | A1* | 12/2019 | Kawamura | H01L 27/124 |
| 2020/0176481 | A1* | 6/2020 | Takeda | H01L 27/124 |

* cited by examiner

*Primary Examiner* — Ryan Crockett
(74) *Attorney, Agent, or Firm* — Hamre, Schumann, Mueller & Larson, P.C.

(57) ABSTRACT

A display device includes a display area, a source driver, a gate driver, a first substrate, a second substrate, and a liquid crystal layer. The liquid crystal layer is disposed between the first substrate and the second substrate. The second substrate includes source lines, gate lines, gate lead-out lines, and bridge lines. The source lines are electrically connected to the source driver. The gate lead-out lines electrically connect the gate driver to the gate lines. The bridge lines connect pairs of the gate lead-out lines that are adjacent in the second direction. At least one of the gate lines is electrically connected to the gate driver via at least two of the gate lead-out lines and one of the bridge lines.

20 Claims, 9 Drawing Sheets

DISPLAY DEVICE ELECTRICAL LINES

FIELD

This disclosure relates to electrical lines for controlling pixels in a display device.

BACKGROUND

A display device controls light emitted/transmitted by each of its pixels so that a desired image is displayed. The voltage(s) of pixel electrodes in the display device adjust the light emitted by or transmitted through portions of an active matrix along the pixel electrodes. The display device can includes a source driver and a gate driver for controlling the voltage of the pixels. The display device can include a thin film transistor (TFT) substrate that includes electrical lines for electrically connecting the source driver and the gate driver to thin film transistors of the pixel electrodes. The electrical lines can include source lines, gate lines, and gate lead-out lines. The source lines electrically connect the source driver to the thin film transistors. The gate lines are electrically connected to the thin film transistors and the gate lead-out lines connect the gate drive to the gate lines.

SUMMARY

A display device includes a first substrate, a second substrate, and a liquid crystal layer disposed between the first substrate and the second substrate. The display device also includes a display area and a source driver and agate driver that are disposed along the same side of the display area. The second substrate includes source lines, gate lines, gate lead-out lines, and bridge lines.

In an embodiment, the source lines extend in a first direction in the display area and are electrically connected to the source driver. The gate lines extend in a second direction in the display area. The gate lead-out lines extend in the first direction in the display area. The bridge lines extend in the second direction in the display area and connect adjacent pairs of the gate lead-out lines. One or more of the gate lines are each electrically connected to the gate driver via at least two of the gate lead-out lines and one of the bridge lines.

In an embodiment, the gate lead-out lines include a first gate lead-out line and a second gate lead-out line that are adjacent in the second direction. The bridge lines include a first bridge line that extends from the first gate lead-out line to the second gate lead-out line. The gate driver is electrically connected to a first gate line via the first gate lead-out line, the second gate lead-out line, and the first bridge line.

In an embodiment, the display device includes spacers disposed in the display area that extending from the first substrate to the second substrate. The second substrate includes base portions that contact the spacers. Each of the base portions are each located at an overlap of one of the source lines and one of the gate lines in plan view, and the gate lead-out lines are spaced apart from the base portions in plan view.

In an embodiment, the second substrate includes extension lines. Each of the extension lines extends between two of the gate lead-out lines that are adjacent in the second direction. Each extension line is connected to one of the two adjacent gate lead-out lines while spaced apart from the second of the two adjacent gate lead-out lines.

In an embodiment, the second substrate includes floating lines. Each of the floating lines extends between two of the gate lead-out lines that are adjacent in the second direction.

In an embodiment, the floating lines are electrically disconnected from the gate lead-out lines.

BRIEF DESCRIPTION OF THE DRAWINGS

Both described and other features, aspects, and advantages of a display device will be better understood with the following drawings:

FIG. 6A is a cross section along the dashed line $VI_A$ in FIG. 5. FIG. 6B is a cross section along the dashed line $VI_B$ in FIG. 5.

Like reference characters refer to similar features.

DETAILED DESCRIPTION

Figure 1:
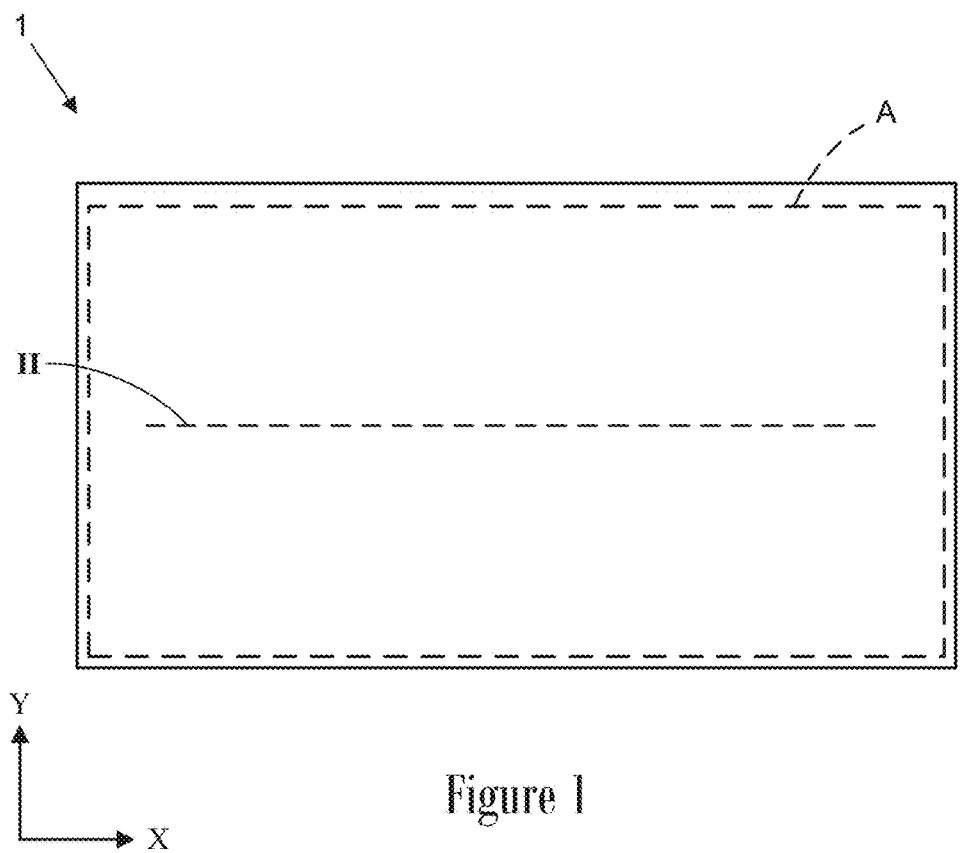
FIG. 1 is a front view of an embodiment of a display device.
Figure 2:
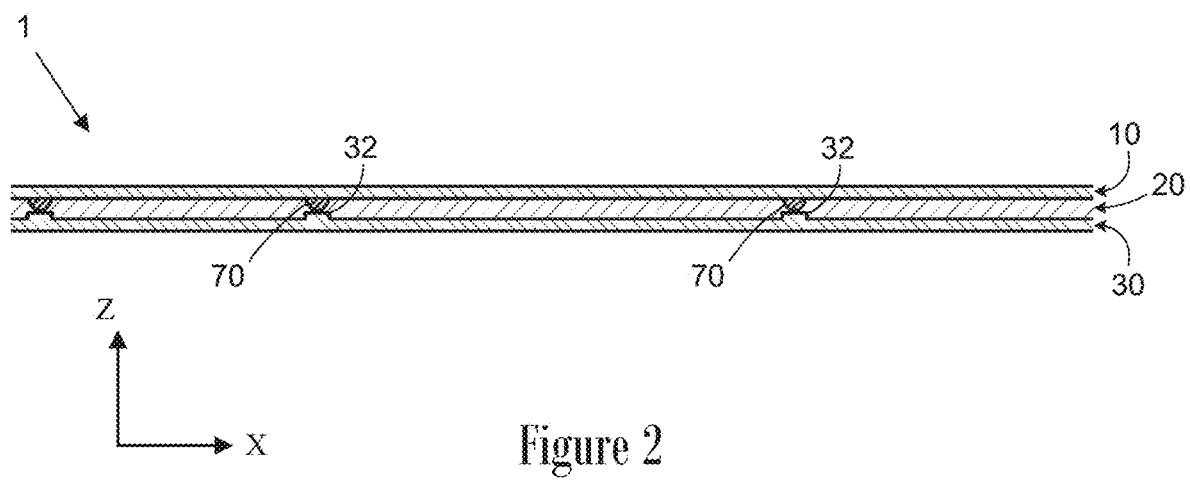
FIG. 2 is a schematic cross section of the display device in FIG. 1, according to an embodiment.

FIG. 1 is a front view of a display device 1. The display device 1 has a display area A that is configured to display a desired image. FIG. 2 is a schematic cross section of the display device 1 along the line II-II in FIG. 1. The display device 1 includes a first substrate 10, a liquid crystal layer 20, a second substrate 30, and spacers 70. The liquid crystal layer 20 is disposed between the first substrate 10 and the second substrate 30. The spacers 70 extend from the first substrate 10 to towards the second substrate 30 within the display area A in plan view. The second substrate 30 is a TFT substrate and is configured to control/manipulate the liquid crystal layer 20 so that a desired image is displayed.

The second substrate 30 includes base portions 32. The spacers 70 are configured to contact the base portions 32 of the second substrate 30. The spacers 70 are configured to space apart the first substrate 10 and the second substrate 30. For example, when the display device 1 is laid flat, the spacers 70 can distribute the weight of the first substrate 10 onto the base portions 32 of the second substrate 30. The spacers 70 maintain the correct spacing between the first substrate 10 and the second substrate 30 and prevent significant squeezing of the liquid crystal layer 20. The number of spacers 70 in the display device 1 is not particularly limited. In an embodiment, the second substrate 30 has at least one base portion 32 for each spacer 70 in the display device 1.

The first substrate 10, liquid crystal layer 20, and second substrate 30 form a display panel. It should be understood that the display device 1 in an embodiment can include additional components. In an embodiment, the display device 1 can include additional components such as, for example, additional display panels, films (e.g., alignment film, brightness film, polarizer film, etc.), and/or other components (e.g., support frame(s), cushion(s), cover(s), etc.).

Figure 3:
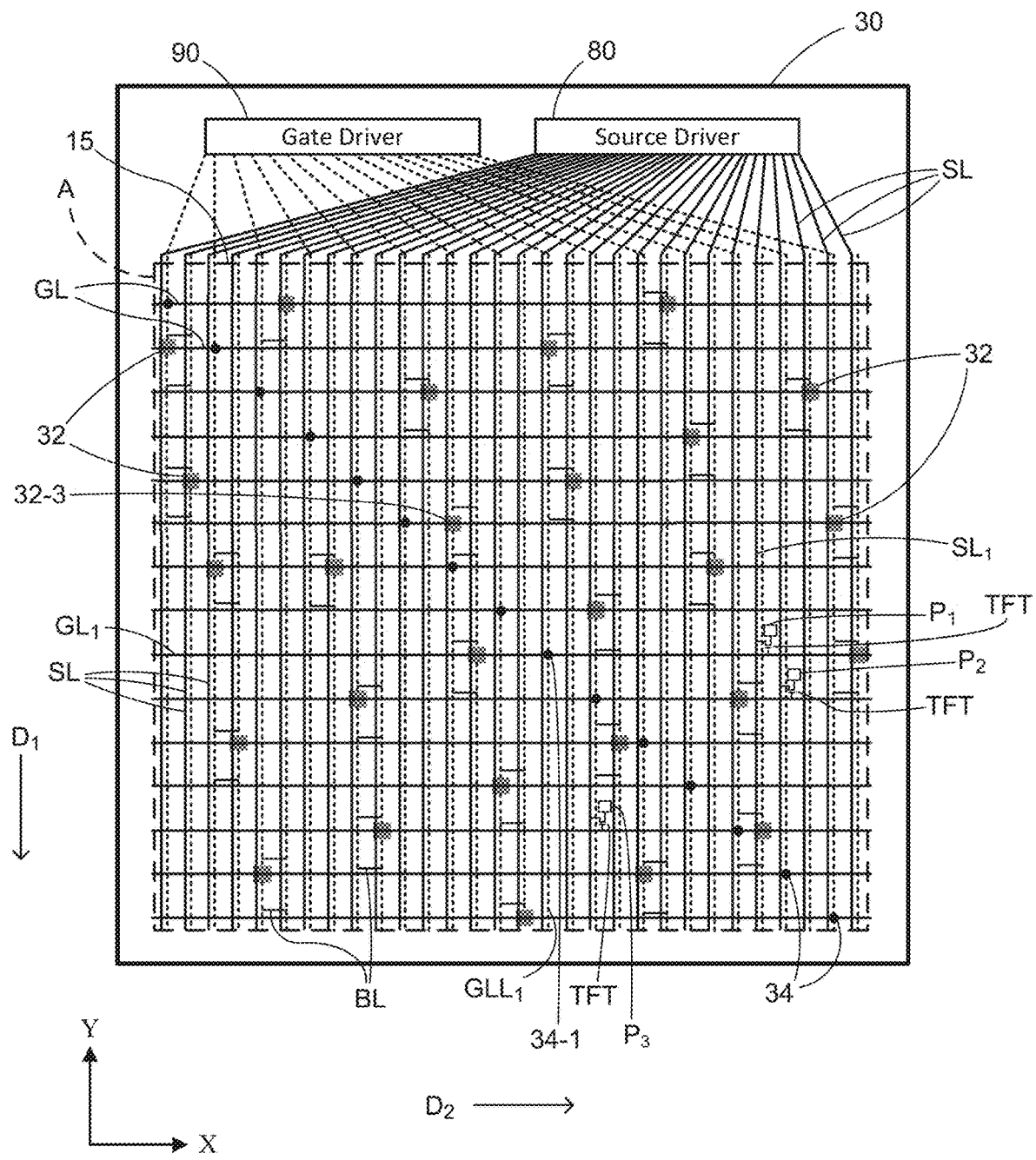
FIG. 3 is a schematic diagram of an embodiment of a TFT substrate of the display device in FIG. 1, according to an embodiment.

FIG. 3 is a schematic diagram of an embodiment of the second substrate 30 in the display device 1. The display area A in FIG. 3 matches with the display area A in FIG. 1 in the thickness direction of the display device 1 (e.g., in the Z direction). The second substrate 30 is a thin film transistor ("TFT") substrate. The display device 1 includes a source driver 80 and a gate driver 90 for supplying voltages to pixel electrodes in the second substrate 30. The source driver 80 and the gate driver 90 are provided along the same side 15 of the display area A. For example, the source driver 80 and gate driver 90 being on the same side 15 allows for bezels along the other sides of the display area A to be smaller. However the source driver 80 may be provided on the different side from the side on which the gate driver 90 is provided. In an embodiment, the second substrate 30 includes the source driver 80 and the gate driver 90.

The second substrate 30 includes a plurality of pixel electrodes in the display area A. Three pixel electrodes $P_1$, $P_2$, $P_3$ are shown in FIG. 3 for illustration purposes. It should be understood that the second substrate 30 includes a large number of pixel electrodes. In various embodiments, the display area A of the second substrate 30 includes hundreds or thousands of pixel electrodes. For example, in the display area A, a pixel electrode is provided in each area that is surrounded by an adjacent pair of gate lines GL and an adjacent pair of source lines SL. The second substrate 30 includes gate lines GL, source lines SL, gate lead-out lines GLL, and bridge lines BL that electrically connect the source driver 80 and the gate driver 90 to each of the pixel electrodes.

The voltage of a pixel electrode $P_1$, $P_2$, $P_3$ manipulates the portion of the liquid crystal layer 20 (shown in FIG. 2) that is along the pixel electrode $P_1$, $P_2$, $P_3$. In an LCD panel/device, the voltage of a pixel electrode controls the amount of light blocked by the portion of the liquid crystal layer along the pixel electrode. In such an embodiment, the display device 1 includes a light source (e.g., backlight unit, LED panel, etc.) that provides light to the second substrate 30 and the liquid crystal layer.

Source driver 80 and gate driver 90 control the voltage of each pixel electrode so that the desired image is displayed by the display device 1. Each pixel electrode is connected to a respective gate line GL and source line SL pair via a thin film transistor. The source driver 80 and the gate driver 90 are electrically connected to the source lines SL and the gate lines GL, respectively. The TFT of each pixel electrode $P_1$, $P_2$, $P_3$ is electrically connected to a respective pair of the gate lines GL and the source lines SL. For example, a first source line $SL_1$ and the first gate line $GL_1$ electrically connect to the thin film transistor TFT for a first pixel electrode $P_1$. The source driver 80 and the gate driver 90 are configured to apply charge/current to each TFT so that each pixel electrode has the desired voltage. The source driver 80 and gate driver 90 utilize the source lines SL, gate lead-out lines GLL, bridge lines BL, and gate lines GL to control the voltage of each pixel electrode individually.

The source lines SL are electrically connected to the source driver 80. The source lines SL directly connect to the source driver 80. The source lines SL extend in a first direction $D_1$ in the display area A. In an embodiment, the source lines SL electrically connect the source driver 80 to the thin film transistors of the pixels electrodes. In FIG. 3, the source lines SL extend directly in the first direction $D_1$. However, the source lines SL in some embodiments can be configured to have some variation as they extend in the first direction $D_1$. For example, the source lines SL in an embodiment generally may extend in the first direction $D_1$, but in a zigzag pattern.

The gate lines GL are electrically connected to the gate driver 90 via the gate lead-out lines GLL and the bridge lines BL. The gate lines GL connect to the gate driver 90 via the gate lead-out lines GLL, the bridge lines BL, and contact holes 34. The gate lead-out lines GLL connect to the gate lines through the contact holes 34. For example as shown in FIG. 3, a gate lead-out line $GLL_1$ contacts the gate line $GL_1$ via a contact hole 34-1. The contact holes 34 are discussed in more detail below. The gate lines GL extend in a second direction $D_2$ in the display area A. In FIG. 3, the gate lines GL extend directly in the second direction $D_2$. However, the gate lines GL in an embodiment may be formed to have some variation as they extend in the second direction $D_2$, as similarly discussed above with respect to variation of the source lines SL.

The second direction $D_2$ and the first direction $D_1$ are different. In FIG. 3, the first direction $D_1$ and the second direction $D_2$ are directly perpendicular to each other. However, the first and second directions $D_1$, $D_2$ in an embodiment may be different without being exactly perpendicular to each other.

The bridge lines BL are disposed in the display area A. Each bridge line BL connects a pair of the gate lead-out lines GLL that are adjacent in the second direction $D_2$. It should be understood that elements that are "adjacent" as described herein means elements next to each other along a single direction (e.g., adjacent in direction $D_1$, adjacent in direction $D_2$, etc.) with another element of the same type not located therebetween. In an embodiment, the bridge lines BL extend in the second direction $D_2$. In an embodiment, the gate lead-out lines GLL extend parallel to the source lines SL as shown in FIG. 3. The gate lead-out lines GLL and source lines SL are shown as being offset in FIG. 3. However, the offset is included in FIG. 3 for illustration purposes. The relative positions of the gate lead-out lines GLL and the source lines SL are discussed in more detail below.

Figure 4:
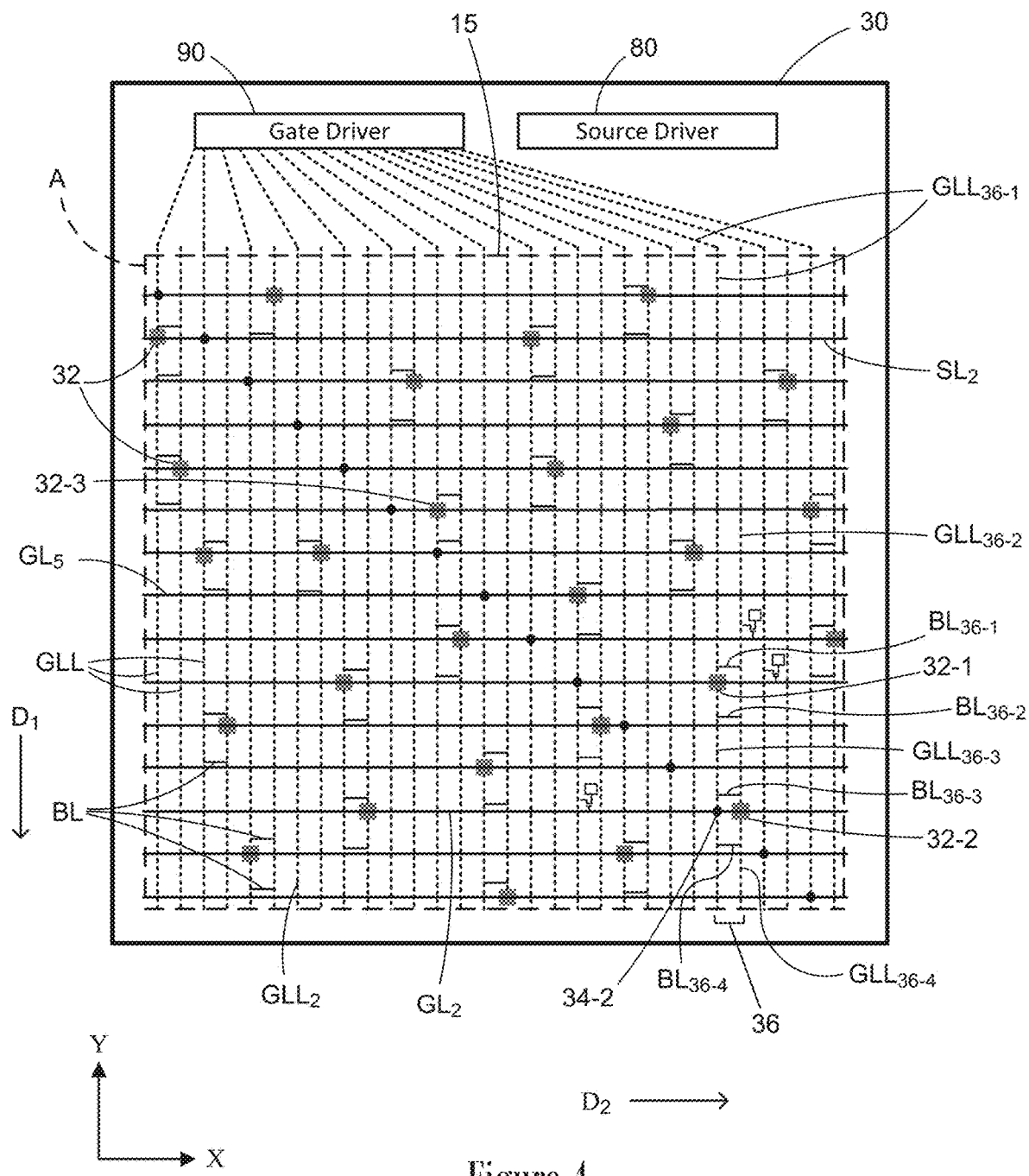
FIG. 4 is the schematic diagram of FIG. 3 in which the source lines removed.

FIG. 4 is the schematic diagram of the second substrate 30 in FIG. 3 with the source lines SL removed. FIG. 4 is provided to help is illustrate the configuration of the gate lead-out lines and the gate lines GL. The gate lead-out lines GLL are configured to not extend across the base portions 32. Each bridge line BL connects a pair of the gate lead-out lines GLL that are adjacent in the second direction $D_2$. The bridge lines BL advantageously connect the adjacent gate lead-out lines GLL to allow a detour around the base portions 32 as discussed below.

There is a plurality of line groups of gate lead-out lines and bridge lines in the display area A. The gate lead-out lines GLL and the bridge lines BL in each line group are electrically connected. Each line group electrically connects the gate driver 90 to a respective gate line GL in the display area A. The gate lead-out lines GLL and the bridge lines BL in each line group form at least a continuous electrically pathway from the side 15 of the display area A to respective contact hole 34. Each line group includes at least two gate lead-out lines GLL and one bridge line BL. In FIG. 4, one of the gate lead-out lines GLL in each line group directly connects to the gate driver 90. In an embodiment, more than one of the gate lead-out lines GLL in the line group may directly connect to the gate driver 90. The gate driver 90 applies a voltage to the line group through its gate lead-out line(s) GLL that directly connect to the gate driver 90.

For example, a line group 36 electrically connects the gate driver 90 to a gate line $GL_2$ via a contact hole 34-2 without overlapping with any of the base portions 32. It should be understood that "overlap" or "overlap in plan view" unless described otherwise means overlapping in the thickness direction (e.g., a negative Z direction, a viewing direction, direction $D_3$ in FIG. 6A). The line group 36 includes four gate lead-out lines $GLL_{36-1}$, $GLL_{36-2}$, $GLL_{36-3}$, $GLL_{36-4}$, and four bridge lines $BL_{36-1}$, $BL_{36-1}$, $BL_{36-3}$, $BL_{36-4}$. A first bridge line $BL_{36-1}$ connects a gate lead-out line $GLL_{36-1}$ and an adjacent gate lead-out line $GLL_{36-2}$ in the second direction $D_2$. A second bridge line $BL_{36-2}$ connects the gate lead-out line $GLL_{36-2}$ and an adjacent gate lead-out line $GLL_{36-3}$ in the second direction $D_2$. The gate lead-out line $GLL_{36-3}$ connects to the contact hole 34-2. The three gate lead-out lines $GLL_{36-1}$, $GLL_{36-2}$, $GLL_{36-3}$ and the two bridge lines $BL_{36-1}$, $BL_{36-2}$ form an electrical pathway from the side 15 of the display A to the contact hole 34-2 to electrically connect the gate driver 90 to the gate line $GL_2$. A bridge line $BL_{36-4}$ connects the gate lead-out line $GLL_{36-3}$ to an adjacent gate lead-out line $GLL_{36-4}$ to increase uniformity and voltage distribution of the gate lead-out lines GLL extending in the display area A, which helps the display device 1 operate correctly.

The adjacent gate lead-out lines $GLL_{36-1}$, $GLL_{36-2}$ are connected by a single bridge line $BL_{36-1}$. The adjacent gate lead-out lines $GLL_{36-2}$, $GLL_{36-3}$ in the line group 36 are individually connected by two of the bridge lines $BL_{36-2}$, $BL_{36-3}$. In an embodiment, the adjacent pair of gate lead-out lines GLL in a line group can be individually electrically connected by one or more bridge lines BL. In an embodiment, the adjacent pair of gate lead-out lines GLL in a line group can be individually electrically connected by two or more bridge lines BL. As shown in FIG. 4, each bridge line BL directly connects its respective pair of adjacent gate lead-out lines GLL. In an embodiment, the bridge line BL is formed in the same layer of the second substrate 30 as the gate lead-out lines GLL.

In FIG. 4, the line groups each include two columns of gate lead-out lines GLL. A column extends in the Y direction or the first direction $D_1$ in FIG. 4. For example, the line group 36 includes two gate lead-out lines $GLL_{36-1}$, $GLL_{36-3}$ that are in a first column and two gate lead-out lines $GLL_{36-2}$, $GLL_{36-4}$ in an adjacent second column. However, it should be appreciated that the line groups in an embodiment may include more than two adjacent columns of gate lead-out lines GLL. For example, a line group may include three adjacent columns of gate lead-out lines GLL in which the third column is adjacent to the second column. A column may include a single gate lead-out line GLL. For example, the gate lead-out line $GLL_2$ in FIG. 4 forms its column by itself.

In an embodiment, the second substrate 30 may include one or more gate lines GL that are electrically connected to the gate driver 90 by just a single gate lead-out lines GLL. For example, the gate line $GL_5$ is electrically connected to the gate driver 90 by just a single gate lead-out line GLL.

Figure 5:
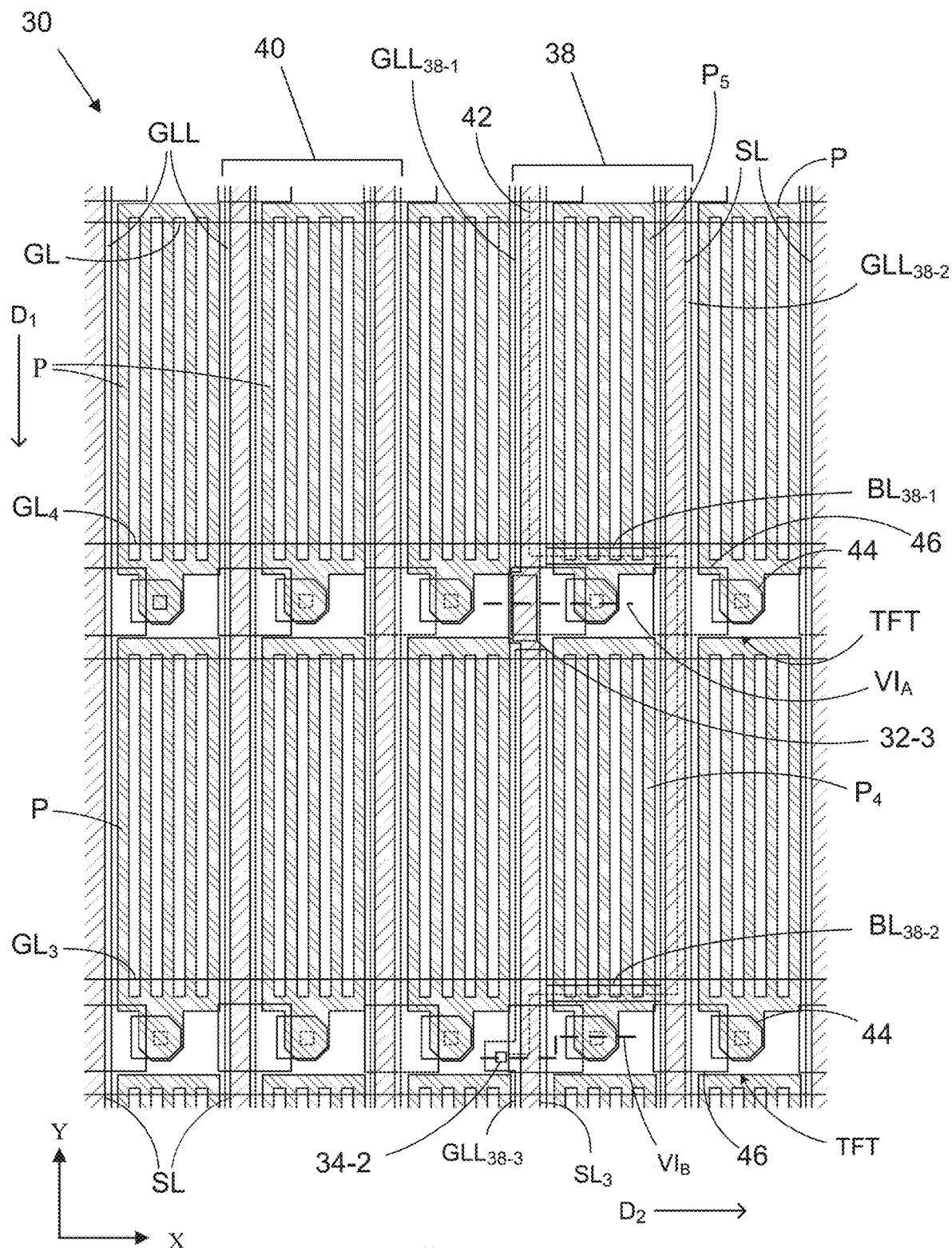
FIG. 5 is an enlarged plan view of a portion of the TFT substrate in FIG. 3, according to an embodiment.

FIG. 5 is a plan view of a portion of the second substrate 30 in FIG. 3, in an embodiment. FIG. 5 illustrates the structure around the base portion 32-3. The base portion 32-3 is located at an overlap between a gate line $GL_4$ and a source line $SL_3$. Pixel electrodes P are arranged in a matrix of columns and rows. In an embodiment, pixel electrodes P are similarly arranged as shown in FIG. 5 throughout the entire display area A (shown in FIG. 4) of the second substrate 30.

Following known principles for thin film transistors, a thin film transistor TFT includes a drain electrode 44, a gate electrode, a source electrode, and a semiconductor layer 46. As shown in FIG. 5, the gate lines GL and the source lines SL overlap with the semiconductor layer 46 at each of the thin film transistors TFTs. At each thin film transistor TFT, a portion of the gate line GL and a portion of the source line SL that overlaps the semiconductor layer 46 act as the gate electrode and source electrode, respectively, of the thin film transistor TFT. The gate lead-out lines GLL are advantageously formed so as to not overlap with the base portions 32 in plan view. This configuration for the base portions 32 is discussed in more detail below.

The gate lead-out lines GLL and the source lines SL both extend in the same direction $D_1$. As shown in FIG. 5, each of the gate lead-out lines GLL fully overlaps with a source line SL in plan view. However, the gate lead-out lines GLL in an embodiment may only partially overlap with their respective source line SL in plan view. In another embodiment, the gate lead-out lines GLL may not overlap with the source lines SL in plan view. In such an embodiment, the gate lead-out lines GLL may each extend side-by-side with a source line SL in plan view.

The bridge lines BL fully overlap with the gate lines GL in plan view. However, the bridge lines BL in an embodiment may only partially overlap with their respective gate line GL. In another embodiment, the bridge lines BL may not overlap with the gate lines GL in plan view. In such an embodiment, the bridge lines BL may each extend side-by-side with a gate line GL in plan view.

The gate lead-out lines GLL are part of line groups 38, 40 of gate lead-out lines GLL and bridge lines BL, as discussed above. A first line group 38 includes gate lead-out lines $GLL_{38-1}$, $GLL_{38-2}$, $GLL_{38-3}$, and bridge lines $BL_{38-1}$ and $BL_{38-2}$. A second line group 40 is adjacent to the first line group 38. Outside of the gate driver 90, the line groups 38, 40 are generally electrically insulated from each other. The line groups 38, 40 electrically connected to different gate lines GL.

A base portion 32-3 is provided at the overlap between a gate line GL and a source line SL. As the gate lead-out lines GLL are configured not to overlap with the base portions 32, the electrical pathway to the contact hole 34-2 has to divert around the base portion 32-3. FIG. 5 includes a dashed arrow to indicate the electrical pathway 42 formed by the line group 38 that circumvents the base portion 32-2 and extends to the contact hole 34-2. In this case, the bridge lines $BL_{38-1}$, $BL_{38-2}$ and second gate lead-out line $GLL_{38-2}$ are used to direct around the base portion 32-3. For example, the gate lead-out line $GLL_{38-1}$ is electrically connected to the gate lead-out line $GLL_{38-3}$ that is adjacent in the first direction $D_1$ across the base portion 32-3 by the gate lead-out line $GLL_{38-2}$ and the bridge lines $BL_{38-1}$, $BL_{38-2}$.

In FIGS. 4 and 5, many of the bridge lines BL provided directly along the gate lead-out line GLL and source line SL junctions that include the base portions 32. However, it should be appreciated the junction including a base portion may not include a bridge line BL for diverting around a base portion 32 in some embodiments. In an embodiment, the bridge lines BL may be provided at source lines SL that do not extend over the base portion 32. In an embodiment, a bridge line BL may be provided at a source line SL that is not adjacent to the source line SL that extends across said base portion 32.

Figure 6A:
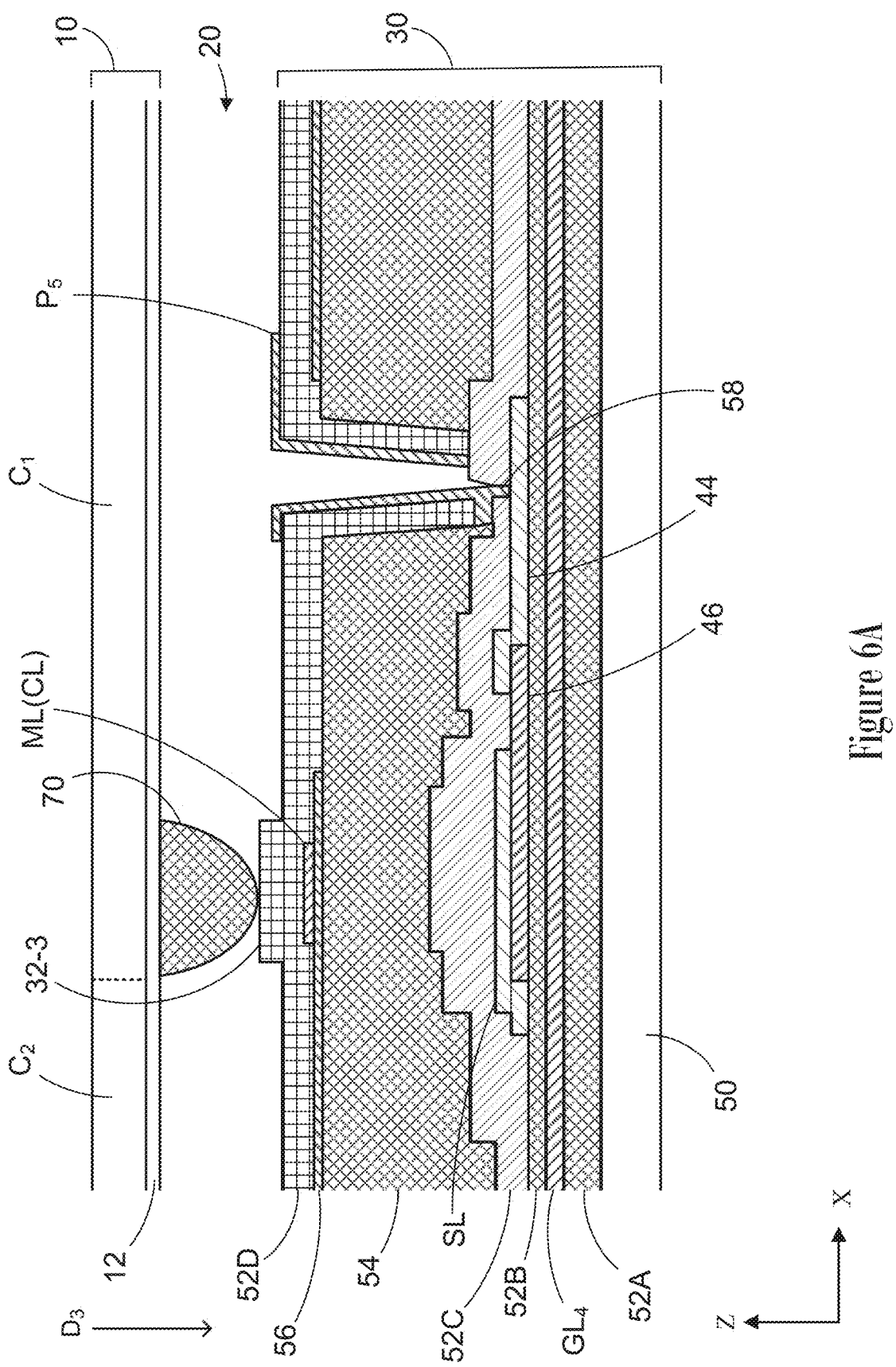
FIGS. 6A and 6B are partial cross sections of the substrates and the liquid crystal layer of the display device of FIG. 1, according to an embodiment.
Figure 6B:
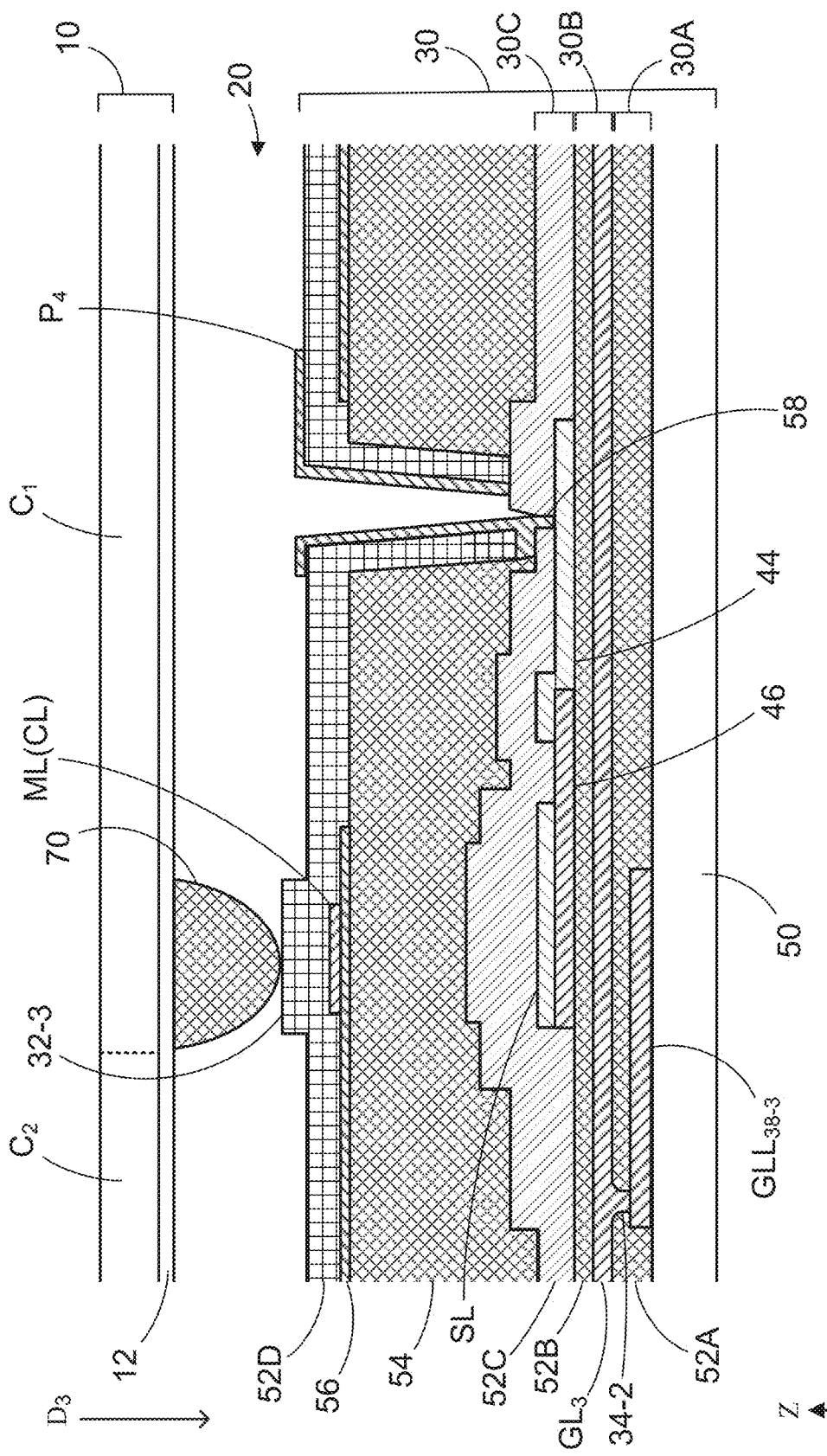

FIGS. 6A and 6B are partial cross sections of the substrates 10, 30, and the liquid crystal layer 20 in an embodiment. FIG. 6A shows a cross section along the base portion 32-3, as indicated by the dashed line $VI_A$ in FIG. 5. FIG. 6B shows a cross section along an intersection of a gate line GL and a source line SL that does not include a base portion 32, as indicated by the dashed line $VI_B$ in FIG. 5. As discussed above, spacers 70 are disposed between substrates 10, 30 and are configured to contact and rest on the base portions 32 of second substrate 30.

As shown in FIG. 6A, the second substrate 30 also includes a base substrate 50, insulator layers 52A, 52B, 52C, 52D, an organic insulator layer 54, common electrodes 56, and metal layer ML provided on the common electrodes 56. In this embodiment, the metal layer is a part of common lines CL connected to the common electrode 56. However, it should be appreciated that the present disclosure is not limited to this configuration. For example, the metal layer ML in an embodiment may not be directly connected to the common lines CL. In some embodiments, the common lines CL and the common electrodes 56 may be provided with the first substrate 10 instead of the second substrate 30. The common electrodes 56 and common lines CL are configured to help control or mitigate stray voltage.

In an embodiment in which the common lines CL are not provided in the display area A, the metal layer ML can have an island-shape in plan view and is not directly connected to the common lines CL disposed in a frame area outside of the display area A. In Such an embodiment, the metal layer ML may not be provided in second substrate 30 as shown in FIG. 6B.

The base substrate 50 provides a base on which the other layers/components of the second substrate 30 can be formed. For example, the base substrate 50 can be made of glass and/or clear polymer. In an embodiment, the base substrate 50 may be a glass sheet. The insulator layers 52A, 52B, 52C, 52D, are configured to provide electrical insulation between different components in the second substrate 30 (e.g., electrodes, lines, semiconductor layer(s), etc.). Hatching is omitted from the base substrate 50 and the first substrate 10 in FIGS. 6A and 6B for general clarity.

The gate lead-out lines GLL are formed on the base substrate 50. A first insulator layer 52A covers the gate lead-out lines GLL in the display area A except for the contact holes 34. For example as shown in FIG. 6B, the contact hole 34-2 is a hole in the first insulator layer 52A through which the gate lead-out line $GLL_{38-3}$ contacts and electrically connects with the gate line $GL_3$. A second insulator layer 52B covers the gate lines GL.

The semiconductor layer 46 and drain electrode 44 are formed on a second insulator layer 52B that is formed on the gate lines GL. The source line SL is formed on and extends over the semiconductor layer 46 and the second insulator layer 52B. The third insulator layer 52C is formed over the source lines SL, the semiconductor layer 46, and the drain electrode 44. The third insulator layer 52C includes contact holes 58 for electrically connecting the pixel electrodes $P_4$, $P_5$ to their respective drain electrode 44. The organic insulator layer 54, common electrodes 56, common lines CL, and fourth insulator layer 52D are formed on the third insulator layer 52C.

As shown in FIGS. 6A and 6B, the gate lead-out lines GLL, the gate lines GL, and the source lines SL are formed in different layers 31A, 31B, 31C of the second substrate 30. The gate lead-out lines GLL are formed in a first layer 31A of the second substrate 30, the gate lines GL are formed in a second layer 31B of the second substrate 30, and the source lines SL are formed in a third layer 31C of the second substrate 30. The first layer 31A, second layer 31B, and the third layer 31C are stacked on the base substrate 50 in said order. In an embodiment, the bridge lines BL are formed in the same layer as the gate lead-out lines GLL (e.g., in the first layer 31A).

To allow correct operation of the thin film transistors TFT, the second insulator layer 52B is configured to allow electric fields of the gate lines GL to affect the semiconductor layers 46 so that the gate lines GL operate as gates for the semiconductor layers 46 and control the charge applied to the drain electrodes 44 by the source lines SL. For example in FIG. 6B, the charge of the gate line $GL_3$ manipulates n or p channel formation in the thin film transistors TFT which controls the charge applied from the source line SL to the drain 44 and the pixel electrode $P_4$.

It should be understood that the thin film transistors TFTs and the configuration of the second substrate 30 and its layers are not limited to the configuration shown in FIGS. 6A and 6B and as described above. In other embodiments, the thin film transistors TFTs may be formed and/or configured in a different manner as is known in the field of display devices. For example, in various embodiments of the display device 1, the second substrate 30 may include source electrode(s) that connect the semiconductor layer(s) 46 to their respective source line(s) SL, the pixel electrode(s) P may directly contact their respective semiconductor layer 46 without the drain electrode(s) 44, and/or the second substrate 30 may include one or more additional layers.

When forming the second substrate 30, some minor variation in each layer occurs. This minor variation can be minimized but generally is difficult to avoid. As more layers are stacked, variations in each layer can add up and affect the top surface of the stacked layers. As shown in FIG. 6A, no gate lead-out line GLL is formed underneath the base portion 32-3. The structure of the base portion 32 is formed with more control as there is one less layer/line under the base portion 32. Not having gate lead-out lines GLL underneath the base portions 32 allows for greater control to make the upper surface of the base portions 32 flat. This advantageously improves the contact of the spacers 70 on the upper surfaces of the base portions 32 and the support and spacing provided by the spacers 70.

The first substrate 10 includes black matrix 12 and color filters $C_1$, $C_2$. In an embodiment, a color filter $C_1$, $C_2$ is provided over each pixel electrode P and is configured to filters the light passing through to a predetermined color (e.g., red, blue, green, white, etc.). However, it should be appreciated that first substrate 10 in some embodiments may not include the color filters $C_1$, $C_2$. The black matrix 12 overlaps at least the gate lead-out lines GLL, the gate lines GL, and the bridge lines BL such that the black matrix 12 covers the gate lead-out lines GLL, the gate lines GL, and the bridge lines BL in the thickness direction $D_3$. The black matrix 12 may be provided in one or more layers or sections.

Figure 7:
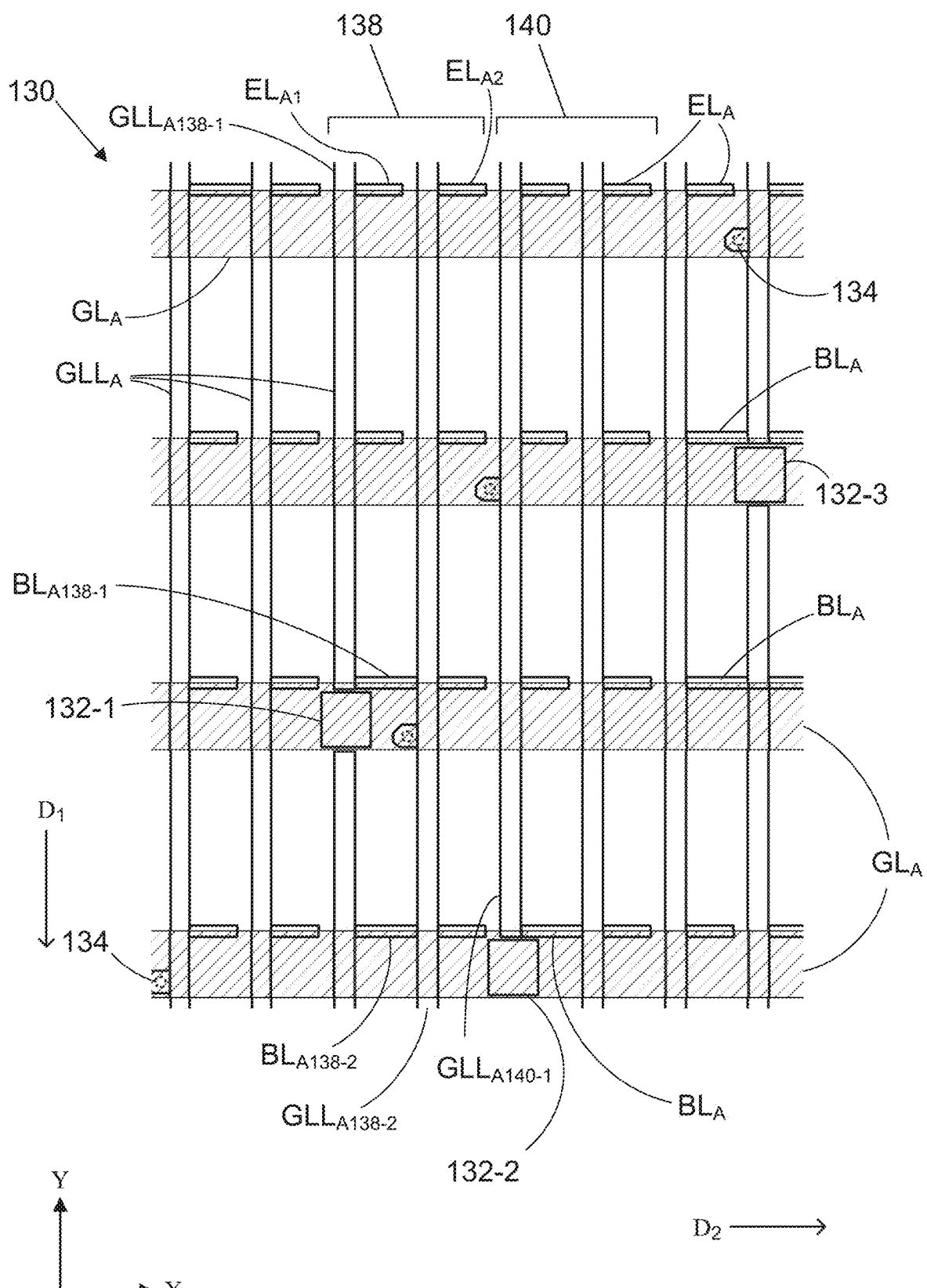
FIG. 7 is a schematic diagram of an embodiment of a TFT substrate for a display device.

FIG. 7 is a schematic diagram of an embodiment of a second substrate 130 in a display device. The second substrate 130 is a TFT substrate and has a similar configuration to the second substrate 30 of FIGS. 2-6B, except as described below. For simplicity and ease of understanding, only gate lead-out lines $GLL_A$, gate lines $GL_A$, bridge lines $BL_A$, extension lines $EL_A$, contact holes 134, and base portions 132 of the second substrate 130 are shown in FIG. 7. The base portions 132-1, 132-2, 132-3 are for supporting spacers (e.g., spacers 70) and have a similar configuration to the base portions 32 as discussed above. The contact holes 134 are for electrically connecting gate lead-out lines $GLL_A$ to their respective gate lines $GL_A$ and have a similar configuration to the contact holes 34 as discussed above. The gate lines $GL_A$ in FIG. 7 include hatching. The gate lines GL in FIG. 5 do not include such hatching for clarity. It should be appreciated that the second substrate 130 in an embodiment can have features and be modified in various embodiments in a similar manner as discussed above regarding the second substrate 30 in FIGS. 2-6B.

The second substrate 130 includes line groups of gate lead-out lines $GLL_A$ and bridge lines $BL_A$ as similarly discussed above for the second substrate 30 in FIGS. 3-5. The line groups allow for detours around the base portions 132 so that the gate lead-out lines $GLL_A$ do not overlap with the base portions 132. Each of the line groups includes at least two adjacent gate lead-out lines $GLL_A$ and one bridge line $BL_A$. For example, two line groups 138, 140 are labeled in FIG. 7. A first line group 138 includes three gate lead-out lines $GLL_{A138-1}$, $GLL_{A138-2}$, $GLL_{A138-3}$, and two bridge lines $BL_{A138-1}$, $BL_{A138-2}$.

The extension lines $EL_A$ each extend between a pair of gate lead-out lines $GLL_A$ that are adjacent in the second direction $D_2$. The extension lines $EL_A$ extend along the gate lines GL in plan view. As shown in FIG. 7, the extension lines $EL_A$ each partially overlap with a respective gate line $GL_A$ in plan view. In an embodiment, an extension line $EL_A$ may fully overlap with a respective gate line $GL_A$ or may not overlap with its respective gate line $GL_A$ in plan view. Each extension line $EL_A$ extends from a first gate lead-out line $GLL_A$ towards a second adjacent gate lead-out line $GLL_A$ and is spaced apart from the second gate lead-out line $GLL_A$ in plan view. An extension line $EL_A$ may extend between adjacent gate lead-out lines GLLA that are in the same line group or between adjacent gate lead-out lines $GLL_A$ that are in different line groups.

For example, an extension line $EL_{A1}$ is connected to a first gate lead-out line $GLL_{A138-1}$ and extends from the first gate lead-out line $GLL_{A138-1}$ towards a second gate lead-out line $GLL_{A138-2}$. The extension line $EL_{A1}$ does not contact the second gate lead-out line $GLL_{A138-2}$ and is spaced apart from the second gate lead-out line $GLL_{A138-2}$ in plan view. For example, another extension line $EL_{A2}$ is connected to the second gate lead-out line $GLL_{A138-2}$ and extends from the second gate lead-out line $GLL_{A138-2}$ towards a gate lead-out line $GLL_{A140-1}$ in a different line group 140. Another extension line $EL_{A2}$ does not contact the gate lead-out line $GLL_{A140-1}$ and is spaced apart from the gate lead-out line $GLL_{A140-1}$ in plan view. The extension lines $EL_A$ can advantageously increase uniformity of the lines in the second substrate 130.

The bridge lines $BL_A$ extend between and electrically connect a pair of gate lead-out lines $GLL_A$ that are adjacent in the second direction $D_2$, as similarly discussed above with respect to the bridge lines BL in FIGS. 3-5. In contrast to the bridge lines BL, the bridge lines $BL_A$ in the substrate 130 extend to and past the adjacent gate lead-out line $GLL_A$. The bridge lines $BL_A$ extend past the adjacent gate lead-out line $GLL_A$ toward a gate lead-out line $GLL_A$ that is adjacent in the second direction $D_2$ and is part of a different line group. The bridge lines $BL_A$ are spaced apart from and do not contact the adjacent gate lead-out line $GLL_A$ of the different line group.

For example, a bridge line $BL_{A138-1}$ extends from the first gate lead-out line $GLL_{A138-1}$ to and past the second gate lead-out line $GLL_{A138-2}$. The bridge line $BL_{A138-1}$ extends past the second gate lead-out line $GLL_{A138-2}$ towards a third gate lead-out line $GLL_{A140-1}$. The bridge line $BL_{A138-1}$ extends from the second gate lead-out line $GLL_{A138-2}$ towards the third gate lead-out line $GLL_{A140-1}$. The third gate lead-out line $GLL_{A140-1}$ is adjacent to the second gate lead-out line $GLL_{A138-2}$ in the second direction $D_2$ and is part of a different line group 140. The bridge line $BL_{A138-1}$ is spaced apart from the third gate lead-out line $GLL_{A140-1}$ in plan view and does not contact the third gate lead-out line $GLL_{A140-1}$. The bridge line $BL_{A138-2}$ has the same configuration as the bridge line $BL_{A138-1}$.

Figure 8:
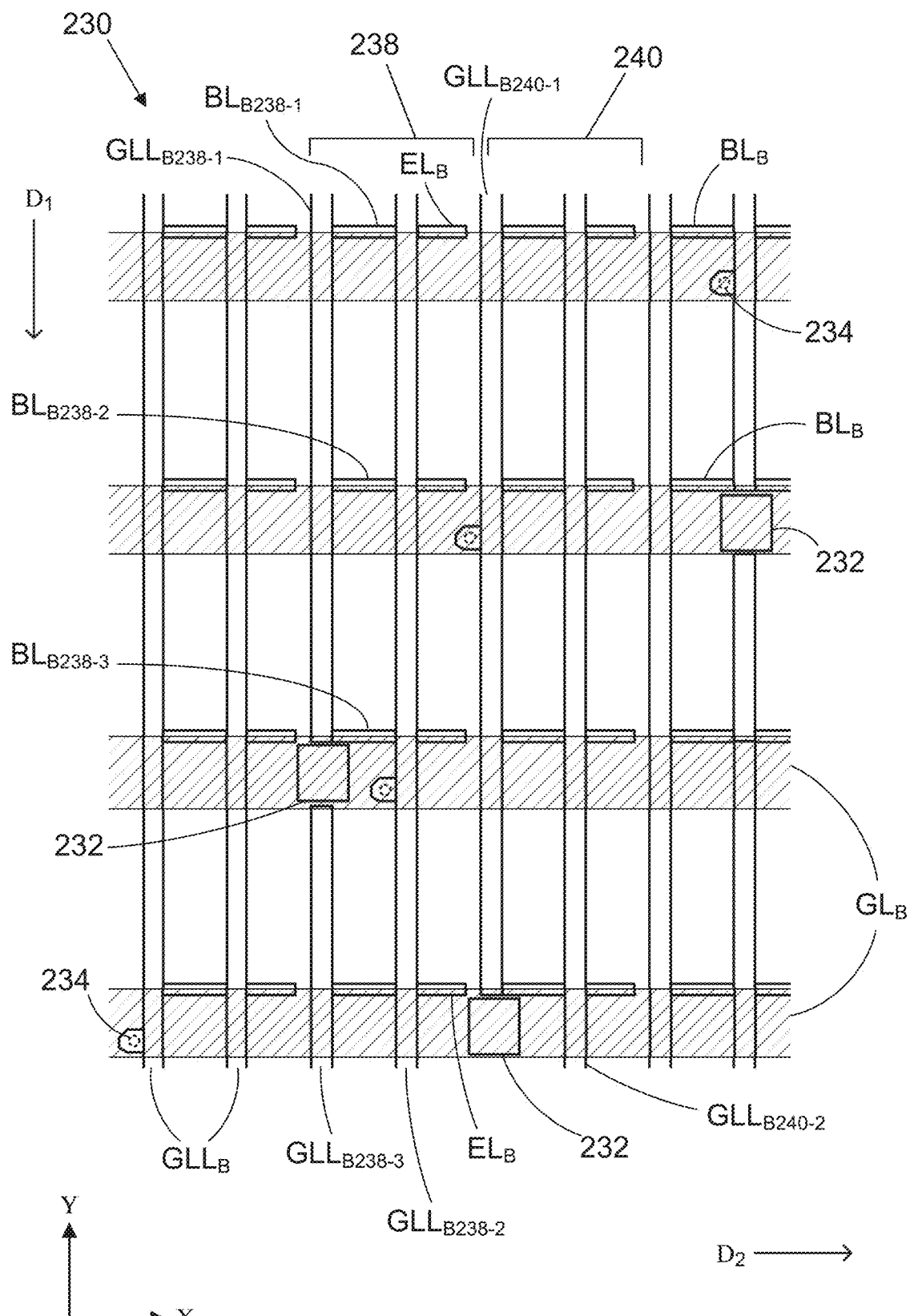
FIG. 8 is a schematic diagram of an embodiment of a TFT substrate for a display device.

FIG. 8 is a schematic diagram of an embodiment of a second substrate 230 in a display device. The second substrate 230 is a TFT substrate and has a similar configuration as the second substrate 130 in FIG. 7, except for the configuration/arrangement of its bridge lines $BL_B$ and extension lines $EL_B$. For simplicity and ease of understanding, only gate lead-out lines $GLL_B$, gate lines $GL_B$, the bridge lines $BL_B$, the extension lines $EL_B$, contact holes 234, and base portions 232 of the second substrate 230 are shown in FIG. 7. The base portions 232 and contact holes 234 are similar to the base portions 132 and contacts holes 134 in the second substrate 130 in FIG. 7 as described above. It should be appreciated that the second substrate 230 in an embodiment can have features and be modified in various embodiments in a similar manner as discussed above regarding the second substrate 30 in FIGS. 2-6B.

The second substrate 230 includes line groups of at least two adjacent gate lead-out lines $GLL_B$ and at least one bridge lines $BL_B$ to provide detours around the base portions 232 similar to the second substrate 130 in FIG. 7. For example, two line groups 238, 240 are labeled in FIG. 8. For example, a first line group 238 includes three gate lead-out lines $GLL_{B238-1}$, $GLL_{B238-2}$, $GLL_{B238-3}$, and a second line group 240 includes two gate lead-out lines $GLL_{B240-1}$, $GLL_{B240-2}$.

The bridge lines $BL_B$ are disposed between the adjacent gate lead-out lines $GLL_A$ that are in the same line group. As shown in FIG. 8, each of the gate lead-out lines $GLL_B$ that are adjacent and in the same line group are electrically connected by a plurality of the bridge lines $BL_B$. For example, three bridges lines $BL_{B238-1}$, $BL_{B238-2}$, $BL_{B238-3}$ each individually electrically connect the two adjacent bridge lines $GLL_{B238-1}$, $GLL_{B238-2}$ of the first line group 238.

The extension lines $EL_B$ are provided between adjacent gate lead-out lines $GLL_B$ that are not in the same line group 238, 240. For example, extension lines $EL_B$ are provided between the gate lead-out line $GLL_{B238-2}$ of the first line group 238 and an adjacent gate lead-out line $GLL_{B240-1}$ of the second line group 240. In this embodiment, there are no extension lines $EL_B$ provided between adjacent gate lead-out lines $GLL_B$ that are in the same line group. In an embodiment, all of the lines extending between adjacent gate lead-out lines $GLL_B$ of the same line group are bridge lines $BL_B$.

Figure 9:
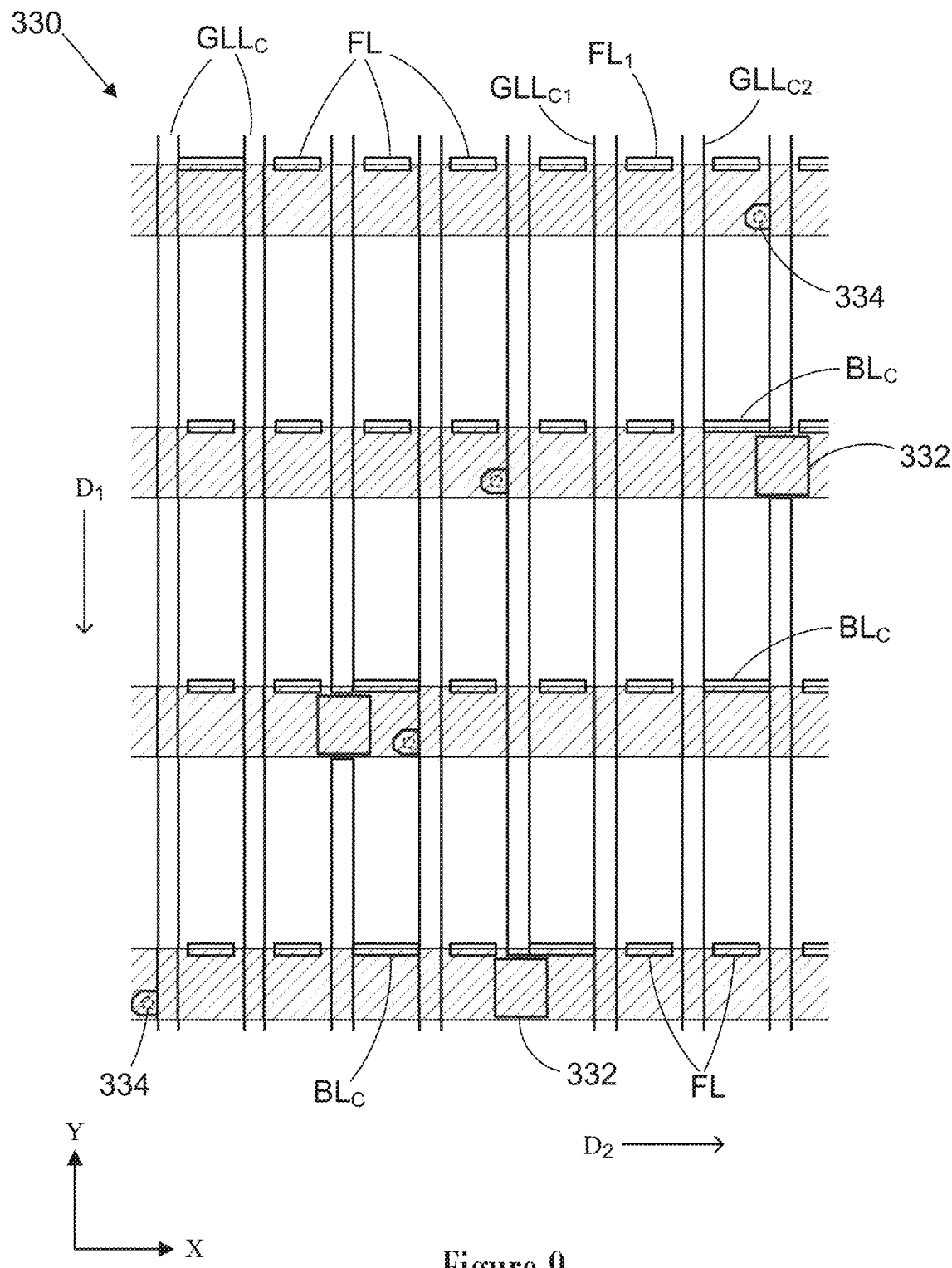
FIG. 9 is a schematic diagram of an embodiment of a TFT substrate for a display device.

FIG. 9 is a schematic diagram of an embodiment of a second substrate 330 in a display device. The second substrate 330 is a TFT substrate and has a similar configuration to the second substrate 30 of FIGS. 2-5B, except as described below. For simplicity and ease of understanding, only gate lead-out lines $GLL_C$, gate lines $GL_C$, bridge lines $BL_C$, float lines FL, contact holes 334, and base portions 332 of the substrate 330 are shown in FIG. 9. The base portions 332 are for supporting spacers (e.g., spacers 70) and have a similar configuration to the base portions 32 as discussed above. The contact holes 334 are for electrically connecting gate lead-out lines $GLL_C$ to their respective gate lines $GL_C$ and have a similar configuration to the contact holes 34 as discussed above. It should be appreciated that the second substrate 330 in an embodiment can have features and be modified in various embodiments in a similar manner as discussed above regarding the second substrate 30 in FIGS. 2-6B.

The second substrate 330 includes the float lines FL. Each float line FL extends between a pair of the gate lead-out lines $GLL_C$ that are adjacent in the second direction $D_2$. The float lines FL extend along the gate lines $GL_C$ in plan view. The float lines FL do not connect to any of the gate lead-out lines $GLL_C$ in the second substrate 330. The float lines FL are electrically disconnected from the gate lead-out lines $GLL_C$ in the second substrate 330. The float lines FL are spaced apart from the gate lead-out lines $GLL_C$ in plan view. In an embodiment, the float lines FL extend in the same direction $D_2$ as the bridge lines $BL_C$.

For example, a float line $FL_1$ extends between a first gate lead-out line $GLL_{C1}$ and an adjacent second gate lead-out line $GLL_{C2}$. The first gate lead-out line $GLL_{C1}$ and the second gate lead-out line $GLL_{C2}$ are not a pair of the gate lead-out lines $GLL_C$. The float line $FL_1$ is spaced apart and does not connect with the first gate lead-out $GLL_{C1}$ or the second gate lead-out line $GLL_{C2}$. In various embodiments, float lines FL can be provided between adjacent gate lead-out lines $GLL_C$ that are electrically connected by bridge line(s) $BL_C$ (i.e., between adjacent gate lead-out lines $GLL_C$ in the same line group) and/or between adjacent gate lead-out lines $GLL_C$ that are not electrically connected by bridge line(s) $BL_C$ (i.e., between adjacent gate lead-out lines $GLL_C$ that are different line groups). In some embodiments, the float lines FL may only be provided between adjacent gate lead-out lines $GLL_C$ that are not electrically connected by bridge line(s) $BL_C$ (i.e., only between adjacent gate lead-out lines $GLL_C$ that are in different line groups). In such embodiments, the float lines FL are not provided between the pairs of the gate lead-out lines $GLL_C$ in the same line group.

It should be understood that a TFT substrate in an embodiment may be configured to include a combination of float lines FL, extension lines EL, and/or the bridge lines BL that extend to and past their adjacent gate line.

The examples disclosed in this application are to be considered in all respects as illustrative and not limitative. The scope of the invention is indicated by the appended claims rather than by the foregoing description; and all changes which come within the meaning and range of equivalency of the claims are intended to be embraced therein.

What is claimed is:

1. A display device, comprising:
a display area with a first side;
a source driver disposed along the first side of the display area in plan view;
a gate driver disposed along the first side of the display area in the plan view;
a first substrate;
a second substrate including:
source lines extending in a first direction in the display area and electrically connected to the source driver,
gate lines extending in a second direction in the display area and electrically connected to the gate driver,
gate lead-out lines extending in the first direction in the display area and electrically connecting the gate driver to the gate lines, and
bridge lines extending in the second direction in the display area and connecting pairs of the gate lead-out lines that are adjacent in the second direction, wherein the gate lines are electrically connected to the gate driver via at least two of the gate lead-out lines and one of the bridge lines;
a liquid crystal layer disposed between the first substrate and the second substrate; and
spacers extending from the first substrate to the second substrate and located in the display area in the plan view, the second substrate including base portions that contact the spacers, the base portions each located at an overlap of one of the source lines and one of the gate lines in the plan view, wherein
the gate lead-out lines are spaced apart from the base portions in plan view.

2. The display device of claim 1, wherein
the gate lead-out lines include a first gate lead-out line and a second gate lead-out line that are adjacent in the second direction, and the bridge lines include a first bridge line that extends from the first gate lead-out line to the second gate lead-out line, and
the gate driver is electrically connected to a first gate line of the gate lines via the first gate lead-out line, the second gate lead-out line, and the first bridge line.

3. The display device of claim 2, wherein
the gate lead-out lines include a third gate lead-out line, the third gate lead-out line being adjacent to the first gate lead-out line in the first direction and adjacent to the second gate lead-out line in the second direction, and the bridge lines include a second bridge line that extends from the second gate lead-out line to the third gate lead-out line, and
the gate driver is electrically connected to the first gate line via the first gate lead-out line, the second gate lead-out line, the third gate lead-out line, the first bridge line, and the second lead-out line.

4. The display device of claim 1, wherein
the gate lead-out lines include a first gate lead-out line, a second gate lead-out line, and a third gate lead-out line that are adjacent in the second direction, and
the bridge lines include a first bridge line, the first bridge line extending from the first gate lead-out line to the second gate lead-out line in the second direction and from the second gate lead-out line towards the third gate lead-out line in the second direction, and the first bridge line spaced apart from the third gate lead-out line.

5. The display device of claim 1, wherein in each pair of the pairs of the gate lead-out lines that are adjacent in the second direction, the pair of the gate lead-out lines are connected by two or more of the bridge lines.

6. The display device of claim 1, wherein in each pair of the gate lead-out lines of the pairs of the gate lead-out lines that are adjacent in the second direction, three or more of the bridge lines independently electrically connect the pair of the gate lead-out lines, the three or more of the bridge members spaced apart in the first direction.

7. The display device of claim 1, wherein the second substrate includes floating lines, each of the floating lines extends between two of the gate lead-out lines that are adjacent in the second direction, and the floating lines spaced apart from the gate lead-out lines and the bridge line.

8. The display device of claim 7, wherein the two of the gate lead-out lines are one of the pairs of the gate lead-out lines connected by the bridge lines.

9. The display device of claim 8, wherein the floating lines are electrically unconnected from the gate lead-out lines.

10. The display device of claim 1, wherein the source lines are formed in a first layer, the gate lines are formed in a second layer, and the gate lead-out lines are formed in a third layer, and the first layer, the second layer, and third layer are different layers of the second substrate.

11. The display device of claim 10, wherein the first layer, the second layer, and the third layer are in stacked in said order.

12. The display device of claim 1, wherein the second substrate includes pixel electrodes and thin film transistors, each of the pixel electrodes electrically connected to one of the gate lines and one of the source lines by one of the thin film transistors.

13. The display device of claim 1, wherein the gate lead-out lines overlap with the source lines in the plan view.

14. The display device of claim 1, wherein the first substrate includes color filters.

15. The display device of claim 1, wherein the second substrate includes at least one gate line that is electrically connected to the gate driver without the bridge lines.

16. A display device, comprising:
a display area with a first side;
a source driver disposed along the first side of the display area in plan view;
a gate driver disposed along the first side of the display area in the plan view;
a first substrate;
a second substrate including:
source lines extending in a first direction in the display area and electrically connected to the source driver,
gate lines extending in a second direction in the display area and electrically connected to the gate driver,
gate lead-out lines extending in the first direction in the display area and electrically connecting the gate driver to the gate lines, and
bridge lines extending in the second direction in the display area and connecting pairs of the gate lead-out lines that are adjacent in the second direction, wherein the gate lines are electrically connected to the gate driver via at least two of the gate lead-out lines and one of the bridge lines;
a liquid crystal layer disposed between the first substrate and the second substrate; and
spacers extending from the first substrate to the second substrate in the display area in the plan view, the spacers overlapping a location at which one of the source lines and one of the gate lines overlap in the plan view, wherein
the gate lead-out lines are spaced apart from the spacers in plan view.

17. The display device of claim 16, wherein
the gate lead-out lines include a first gate lead-out line and a second gate lead-out line that are adjacent in the second direction, and the bridge lines include a first bridge line that extends from the first gate lead-out line to the second gate lead-out line, and
the gate driver is electrically connected to a first gate line of the gate lines via the first gate lead-out line, the second gate lead-out line, and the first bridge line.

18. The display device of claim 16, wherein
the gate lead-out lines include a first gate lead-out line, a second gate lead-out line, and a third gate lead-out line that are adjacent in the second direction, and
the bridge lines include a first bridge line, the first bridge line extending from the first gate lead-out line to the second gate lead-out line in the second direction and from the second gate lead-out line towards the third gate lead-out line in the second direction, and the first bridge line spaced apart from the third gate lead-out line.

19. The display device of claim 16, wherein in each pair of the gate lead-out lines of the pairs of the gate lead-out lines that are adjacent in the second direction, three or more of the bridge lines independently electrically connect the pair of the gate lead-out lines, the three or more of the bridge members spaced apart in the first direction.

20. The display device of claim 16, wherein the second substrate includes floating lines, each of the floating lines extends between two of the gate lead-out lines that are adjacent in the second direction, and the floating lines spaced apart from the gate lead-out lines and the bridge line.

* * * * *